United States Patent
Murakami

[11] Patent Number: 5,380,371
[45] Date of Patent: Jan. 10, 1995

[54] PHOTOELECTRIC CONVERSION ELEMENT AND FABRICATION METHOD THEREOF

[75] Inventor: Tsutomu Murakami, Nagahama, Japan

[73] Assignee: Canon Kabushiki Kaisha, Tokyo, Japan

[21] Appl. No.: 936,775

[22] Filed: Aug. 28, 1992

[30] Foreign Application Priority Data

Aug. 30, 1991 [JP] Japan .................. 3-244938
Aug. 30, 1991 [JP] Japan .................. 3-244939

[51] Int. Cl.$^6$ .................. H01L 31/04; H01L 31/0216; H01L 31/0224; H01L 31/18
[52] U.S. Cl. .................. 136/256; 136/258; 427/74; 437/2; 437/4; 437/181; 437/195; 257/740; 257/753
[58] Field of Search ......... 136/256, 258 AM, 258 PC, 136/244, 249 MS; 427/74; 437/2-5, 181, 195; 257/740, 753

[56] References Cited

U.S. PATENT DOCUMENTS

| | | | |
|---|---|---|---|
| 4,586,988 | 5/1986 | Nath et al. | 204/15 |
| 4,590,327 | 5/1986 | Nath et al. | 136/256 |
| 4,633,033 | 12/1986 | Nath et al. | 136/256 |
| 4,633,034 | 12/1986 | Nath et al. | 136/256 |
| 4,774,193 | 9/1988 | Juergens | 434/4 |

FOREIGN PATENT DOCUMENTS

| | | | |
|---|---|---|---|
| 0236936 | 3/1989 | European Pat. Off. | 437/4 |
| 0392695 | 10/1990 | European Pat. Off. | 136/256 |
| 1614773 | 12/1979 | Germany | 136/256 |
| 60-066426 | 4/1985 | Japan | 437/2 |
| 60-234379 | 11/1985 | Japan | 136/256 |
| 61-268072 | 11/1986 | Japan | 136/256 |
| 62-119979 | 5/1987 | Japan | 136/244 |
| 1-057762 | 6/1989 | Japan | 136/256 |
| 1558764 | 1/1980 | United Kingdom | 136/256 |

OTHER PUBLICATIONS

K. A. Baert et al, *IEEE Transactions on Electron Devices*, vol. 37, Mar. 1990, pp. 702–707.

*Primary Examiner*—Aaron Weisstuch
*Attorney, Agent, or Firm*—Fitzpatrick, Cella, Harper & Scinto

[57] ABSTRACT

A thin film solar cell having a semiconductor layer deposited on a substrate is composed of a passivation layer made of a polymer resin coated on the upper portion of the semiconductor layer, and an upper electrode made of a conductive paste laminated on the passivation layer. Also, a collector electrode may be laminated on the upper electrode by electroplating. A method for fabricating a solar cell by depositing a semiconductor layer on the substrate includes coating a passivation layer made of a polymer resin on the upper portion of the semiconductor layer, and laminating an upper electrode made of a conductive paste containing a component capable of dissolving the polymer resin on the passivation layer. Also, the method may include laminating a collector electrode on the upper electrode by electroplating.

28 Claims, 7 Drawing Sheets

PHOTOELECTRIC CONVERSION ELEMENT AND FABRICATION METHOD THEREOF

BACKGROUND OF THE INVENTION

1. Field of the Invention

The present invention relates to a photoelectric conversion element, or a photovoltaic element which converts light to electric energy, and more particularly to a solar cell having excellent mass producibility and high reliability, and a fabrication method of the solar cell.

2. Related Background Art

Solar cells which are photoelectric conversion elements for converting solar light to electric energy have been considered a substitute energy source for oil. Examples of solar cells include single crystal silicon solar cells, polycrystalline silicon solar cells, and amorphous silicon-type solar cells.

The fabrication method of the single crystal silicon solar cell relies on a semiconductor process with a high production cost. Since single crystal silicon has a small light absorption coefficient due to its indirect band gap transition, a solar cell of single crystal silicon must be at least 50 microns thick to absorb the incident solar light, resulting in a high cost of material; and with the band gap being about 1.1eV, the short wavelength components having a wavelength of not more than about 500 nm within the solar light spectra cannot be effectively used because of the problem of the surface recombination or wasted energy at or below the band gap.

Polycrystalline silicon also has an indirect band gap transition problem even though it can have a reduced production cost, as compared with the single crystal silicon, so that the thickness of the solar cell cannot be reduced. Moreover, polycrystalline silicon has also other problems such as grain boundaries.

Meanwhile, as one candidate for substituting solar cells for utility generated electric power, the electric power necessary for an individual house is about 3KW. On the other hand, since the solar energy flux is 1Kw/m at peak, solar cells occupying an area as large as are necessary if the conversion efficiency is 10%. Accordingly, it is necessary to fabricate a solar cell module as large as possible in order to use them as the electric power source.

However, with single crystal silicon, a large wafer cannot be fabricated, so that realization of a large area cell is difficult, whereby it is requisite to provide wiring to connect unit elements in series or parallel in order to obtain a large power output. Further, since the single crystal silicon is mechanically weak, an expensive encapsulation made of glass or polymer resin, or an aluminum frame is necessary in order to protect the solar cell from mechanical damage caused by various weather conditions when it is used outdoors. Consequently, there is a problem that the production cost per unit amount of power generation is higher than the existing power generation methods.

In view of these considerations, studies have been made of the amorphous silicon-type solar cell which can be produced at a low cost and with a large area.

FIGS. 7A to 7C show typical examples of conventional solar cells. In the figures, 700 is a solar cell main body, 702 is a lower electrode, 703 is an n layer, 704 is an i layer, 705 is a player, 706 is a transparent electrode, 707 is a passivation layer, 708 is a collector electrode, and 709 is a bus bar.

The structure of an amorphous silicon-type solar cell is generally obtained by laminating the transparent electrode 706 for the reduction of surface resistance on one or more pairs of semiconductor junctions composed of the thin film p layer 705, the i layer 704, and the n layer 703 provided on the substrate 701, thereafter depositing the collector electrode 708 made of a relatively thin metal layer for collecting the electric current, and further depositing an electrode made of a relatively thick metal called the bus bar 709 for the collection of the current collected by the collector electrode 708.

The problem encountered when such an amorphous silicon-type solar cell is deposited on a large substrate, e.g. about 30 cm square, or continuously deposited on a long substrate with a roll-to-roll method, is that pin holes or other defects occur in the fabrication process, causing a shunt or short circuit, so that the conversion efficiency of solar cell may decrease. This is due to the fact that since the substrate surface is not a completely smooth plane, and may contain some flaws, dimples or spike-like projections, or may be provided with an irregular back reflector for the purpose of reflecting the light impinging on the substrate, a thin film semiconductor layer only several hundreds Å thick such as a the p or n layer cannot cover such a surface. In addition, pin holes may occur due to the presence of dust particles during the film formation. There is no problem if a normal semiconductor junction exists between the lower and upper electrodes, but if the semiconductor junction is lost due to a defect as mentioned above so that the upper and lower electrodes are directly contacted with each other, or if a spike from the substrate is placed in contact with the upper electrode, or if the semiconductor layer becomes of low resistance even though not completely lost, the electric current produced by the light will flow into such defective portion, whereby the photogenerated current cannot be effectively collected. When the defective position is away from the collector electrode or the bus bar, the resistance of the current flowing into the defective portion is great, with relatively small current losses, but conversely, if it is under the collector electrode or the bus bar, the lost current is greater due to such defect.

Owing to the opacity of the collector electrode and the bus bar, the effective area of the solar cell is reduced. .In order to reduce the area of the collector electrode and the bus bar, and output the electric current effectively, it is desirable to reduce the specific resistances of the collector electrode and the bus bar and to increase the cross-section of the electrode. Accordingly, a material having a small resistivity such as silver or copper is suitable as the electrode material. For example, the resistivity of silver is $1.62 \times 10^{-6}$ $\Omega$cm and the resistivity of copper is $1.72 \times 10^{-6}$ $\Omega$cm, while aluminum has a resistivity of $2.75 \times 10^{-6}$ $\Omega$cm and zinc has a resistivity of $5.9 \times 10^{-6}$ $\Omega$cm.

The conventional methods for forming such an electrode are any one of the vapor deposition method, the plating method, or the printing method if the solar cell is of crystal type. With the vapor deposition method, a good quality metal can be deposited in excellent ohmic contact with the semiconductor, but there is a disadvantage that the deposition rate is slow, the throughput is low due to the vacuum process, and a mask is required to form a specific pattern. With the plating method, electroless plating of Ni is generally conducted, but has a problem that exfoliation easily occurs and a mask is required. The printing method has an advantage that automation is most easily realized and the mass producibility is high, one method being adopted in which Ag paste is screen printed, sintered at high temperature, and contacted. To decrease the resistance, it is contemplated that a plating or soldering coat be applied to the printed electrode.

In the amorphous silicon-type solar cell, all the above methods have been investigated, but practically, the printing method has been implemented because of its superior mass producibility. However, the amorphous silicon cannot be sintered, unlike the above-mentioned crystal type, so that a highly resistive electrode results. That is, since the conductive paste of silver contains a polymer resin as the binder, the resistivity is about $4 \times 10^{-5}$ $\Omega$cm, which is one digit higher than that of the pure silver. Accordingly, in order to reduce the resistance without changing the area of collector electrode, it is desirable to increase the thickness of the electrode. However, with the increased thickness, it is necessary to raise the viscosity of the conductive paste; however there is a limit because the screen may become clogged. Therefore, the thickness of practical electrodes fabricated by the screen printing is in a range of 10 $\mu$m to 20 $\mu$m. Accordingly, the collector electrodes fabricated by the screen printing tended to be wider to decrease the resistance.

Thus, in current practice, when screen printing is used, small electrodes cannot be formed, resulting in a great loss of effective area.

Meanwhile, as a countermeasure against shunt or short circuits as described above, it is effective for preventing the decrease in the conversion efficiency that only the defective part be selectively covered with an insulating material or material having an adequately high resistance to increase the contact resistance with the transparent electrode, the collector electrode, or the bus bar. Selective treatment of only the defective part is the best method, but requires a complex process.

Other than such a selective insulation, there are known methods in which the portion under the bus bar having the greatest influence is insulated with polymer or oxide as disclosed in U.S. Pat. No. 4,590,327, and shown in FIG. 7C, in which the portion corresponding to the pattern of the bus bar and collector electrode between the semiconductor layer and the transparent electrode is provided with a material having a low electrical conductivity of 3000 $\Omega/\square$ or greater, or an insulating material as disclosed in U.S. Pat. Nos. 4,633,033 and 4,633,034.

However, since in the conventional method the insulating material or highly resistive material is disposed in accordance with the pattern of the bus bar and collector electrode, it is necessary that the insulating material having substantially the same shape be patterned to correspond to the bus bar, thus resulting in an impractical process due to the necessity of a patterning process. Also, since the bus bar is laminated on the insulating material or highly resistive material, the adhesion strength is weak, thus requiring an adhesive for the bus bar.

Also, since in the conventional method the collector electrode itself is provided with the resistance, instead of providing the insulating material under the collector electrode, the series resistance of the solar cell is great, resulting in a low conversion efficiency. If only the collector electrode is fabricated by the normal method to avoid such drawback, there is a great possibility of causing a short circuit when the under portion of the collector electrode contains some defects.

Also, the solar cell is unstable to ambient conditions such as heat, light or humidity, even though the initial characteristic of solar cell module is sufficient. For this reason, there is a possibility that a short circuit might occur in actual use.

The plating method can be used as with the crystal system, and for example, in Japanese Patent Application Laid-Open No. 60-66426, there is disclosed a method of forming an electrode on the transparent electrode of the solar cell by the plating method. However, with this method, it is necessary to perform the patterning with the resist to protect portions other than the collector electrode from being plated. The plating method has associated therewith several problems due to the necessity of patterning, e.g. the fabrication process becomes complex, or if a thick plating membrane is formed on the transparent electrode, the solar cell may be adversely affected because the solar cell must be immersed in the acid or alkali plating bath for a long time, or the formed electrode is easily exfoliated due to its thick membrane. Moreover, in plating, a problem may arise that the transparent electrode is easily affected by hydrogen produced in a competing reaction.

SUMMARY OF THE INVENTION

An object of the present invention is to solve the aforementioned problems associated with thin film solar cells, and to provide solar cells having excellent characteristics.

Another object of the present invention is to provide a solar cell having excellent durability in actual use.

Also, another object of the present invention is to provide a fabrication method for a solar cell having excellent mass producibility and high reliability.

A further object of the present invention is to provide a fabrication method for a solar cell having excellent characteristics and a high yield by passivating defects of the solar cell.

In order to accomplish the above-mentioned objects, the present invention provides a thin film solar cell having a semiconductor layer deposited on a substrate, comprising a passivation layer made of a polymer resin and coated on the semiconductor layer, and an upper electrode made of a conductive paste and laminated on the passivation layer.

Also, it is characterized by a collector electrode being laminated on the upper electrode by electroplating.

The polymer resin is preferably selected from at least one of polyester, a copolymer of ethylene and vinyl acetate, acrylic, epoxy, and urethane. Also, the polymer resin desirably has a transmittance of 90% or greater with respect to solar light, and a substantially electrical insulating property. The metallic component of the conductive paste preferably contains at least one of silver, palladium, copper, carbon, and their alloys.

The present invention provides a method for fabricating a thin film solar cell layer deposited on a substrate, comprising the steps of coating a passivation layer made of a polymer resin on the semiconductor layer, and laminating an upper electrode made of a conductive paste containing a component capable of dissolving the polymer resin on the passivation layer.

Also, it is characterized in that a collector electrode is laminated on the upper electrode by electroplating.

The fabrication method for the polymer resin is desirably any one selected from electrocoating, electrolytic polymerization, plasma polymerization, spin coating, roll coating, and dipping. The component of the conductive paste for dissolving the polymer resin desirably contains at least one of ethyl acetate, methyl ethyl ketone, and toluene. In some casest it may be an unreacted component of the polymer resin binder.

The metal for electroplating desirably contains at least one of copper, aluminum, and chromium.

As described above, by forming a passivation layer of polymer resin and the upper electrode of conductive past on the semiconductor layer of the solar cell, the upper electrode is prevented from making contact with defective portions of the semiconductor layer which may cause a shunt or a short circuit. Also, by forming the collector electrode by electroplating, it is possible to form a low resistance collector electrode. As a result, the loss of photoelectric current owing to the short circuit is avoided, and the effective area will increase with the narrow width of collector electroder whereby a highly efficient solar cell can be obtained.

That is, when the conductive paste is applied, a solvent contained in the paste or a monomer of the polymer resin binder will partially dissolve the passivation layer, causing a conductive filler to place the transparent electrode and the collector electrode in electrical contact, while at the same time the passivation and the polymer resin binder cover the defective portion, whereby the short circuit(s) can be suppressed. Moreover, a collector electrode having excellent adhesion can be selectively formed by electroplating on the upper electrode formed of conductive paste. Consequently the wiring resistance is made smaller, whereby a solar cell having a high conversion efficiency and durability can be obtained.

DETAILED DESCRIPTION OF THE PREFERRED EMBODIMENTS

Figure 1A:
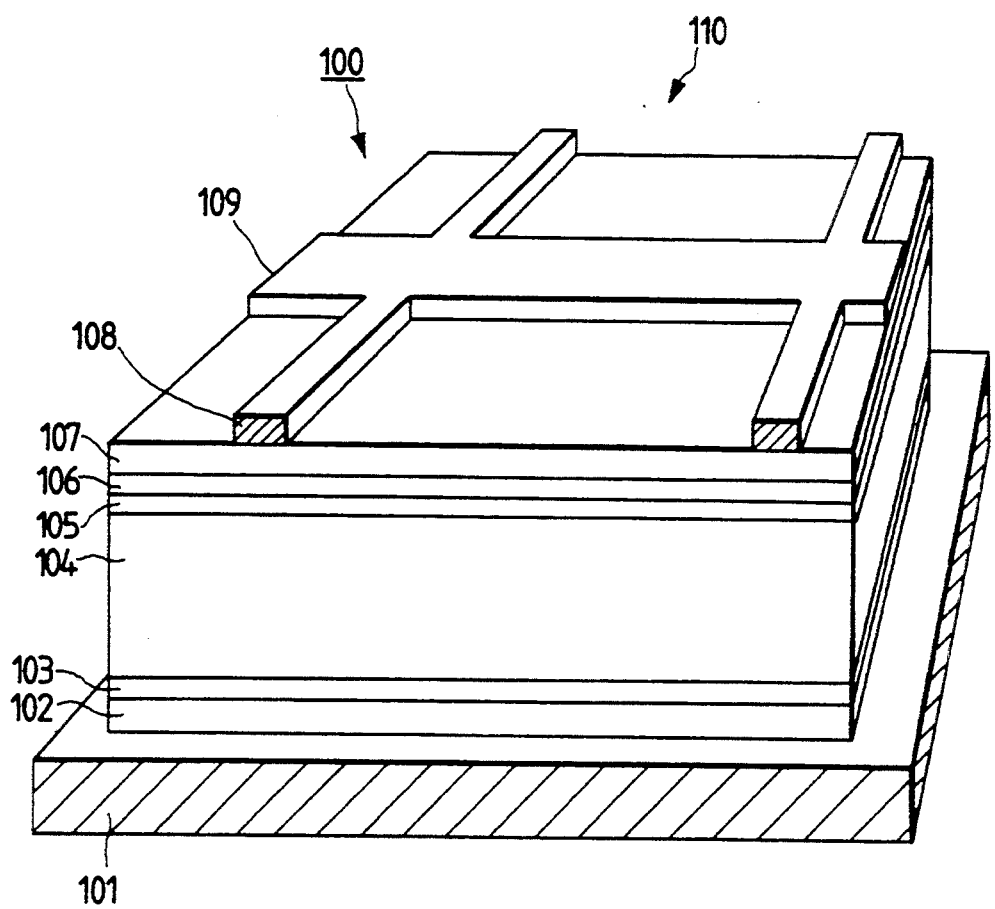
FIGS. 1A to 1C are perspective views schematically illustrating the constitution of a solar cell according to the present invention.
Figure 1B:
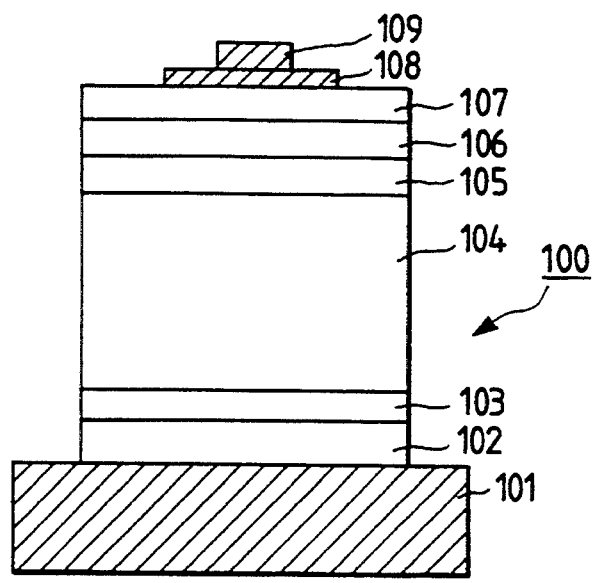
Figure 1C:
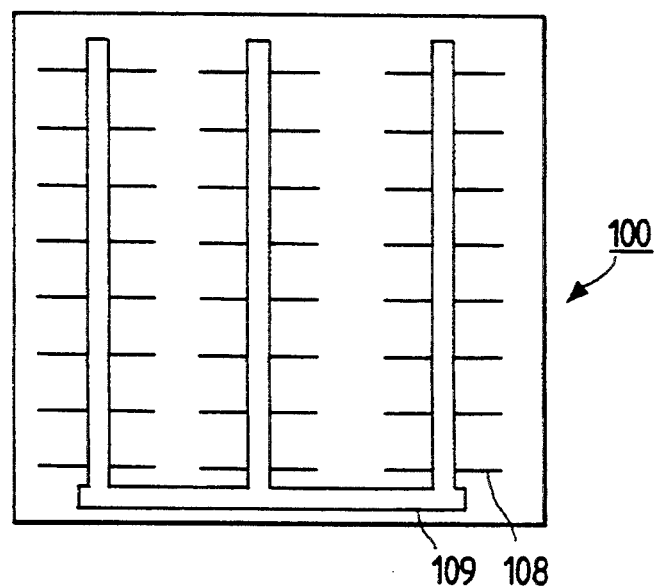

FIG. 1A shows schematically the constitution of a pintype amorphous solar cell. FIG. 1B is a view representing the cross section of FIG. 1A. FIG. 1C is a top view of FIG. 1A.

FIG. 1A shows a solar cell upon which light 110 is incident from above. In the figure, 100 is a solar cell main body, 101 is a substrate, 102 is a lower electrode, 103 is a n-type semiconductor layer, 104 is an i layer, 105 is a p layer, 106 is a transparent electrode, 107 is a passivation layer, 108 is an upper electrode, and 109 is a bus bar.

The substrate 101 may be either electrically conductive or dielectric. Specifically, a metal such as Fe, Ni, Cr, Al, Mo, Au, Nb, Ta, V, Ti, Pt, Pb, or the like, and their alloys, a thin plate made of brass, stainless, or the like and their composites, and a heat resistant synthetic resin such as polyester, polyethylene, polycarbonate, cellulose acetate, polypropylene, polyvinylchloride, polyvinylidene chloride, polystyrene, polyamide, polyimide, epoxy, as a sheet thereof, or their composites with glass, carbon, boron, a metallic fibers, a material formed with a surface coating in which a metallic thin film of dissimilar material and/or an insulating thin film of e.g. $SiO_2$, $Si_3N_4$, $Al_2O_3$, AlN or the like is coated on the surface of a thin metal plate or a resin sheet, for example, by sputtering, vapor deposition, plating or the like, and glass or ceramics may be used.

When the substrate 101 is electrically insulating, a lower electrode 102 is formed by depositing on the surface of substrate 101 a simple metallic substance such Al, Ag, Pt, Au, Ni, Ti, Mo, W, Fe, V, Cr, Cu, stainless, brass, nichrome, $SnO_2$, $In_2O_3$, ZnO, ITO, or their alloys, and a transparent electrical conductive oxide (TCO), for example, by plating, vapor deposition, and sputtering. Also, even if the substrate 101 is electrically conductive, the lower electrode 102 can be formed by using the same material and means making the surface smoother or textured.

The n layer 103, the i layer 104, and the p layer 105 are fabricated by the normal thin film fabrication process, for example, any one of the well known methods such as vapor deposition, sputtering, HF plasma CVD, microwave plasma CVD, ECR plasma CVD, thermal CVD, or LPCVD, as desired. Industrially, a plasma CVD method is preferably adopted in which a source gas is decomposed by the plasma and deposited on the substrate. Also, for the reactor, a batch apparatus or a continuous film formation apparatus can be used as needed.

The solar cell, which is a photovoltaic element according to the present invention, can be a so-called tandem cell in which two or more pairs of pin junctions are laminated together for the purpose of improving the spectral sensitivity or the voltage. Examples of suitable semiconductor materials for making up the i layer 104 used for the solar cell of the present invention include Group IV or Group IV alloy-type amorphous semiconductors such as a-Si:H, a-Si:F, a-Si:H:F, a-SiGe:H, a-SiGe:F, a-SiGe:H:F, a-SiC:H, a-SiC:F, a-SiC:H:F, or the like.

The semiconductor material making up to p layer 105 or the n layer 103 used for solar cell of the present invention can be obtained by doping a valence electron control agent into the semiconductor material constituting the i layer 104. The same fabrication method as that used for the i layer 104 can be used. When a deposited film of an element of the Group IV element of the periodic table is formed, a compound containing an element of the Group III in the periodic table is used as the valence electron control agent to obtain the p-type semiconductor. Examples of the Group III element include B, Al, Ga, and In.

A compound containing an element of the Group V of the periodic table can be used for the valence electron control agent to obtain an n-type semiconductor. Examples of the Group V element include P, N, As, and Sb.

The transparent electrode 106 for use in the present invention desirably has a light transmittance of 85% or greater to efficiently transmit the light from the sun, a white fluorescent lamp or the like into the semiconductor layer, and further desirably has a sheet resistance of 100 $\Omega/\square$ or less to cause the electric current produced by the light to electrically flow transversely across the semiconductor layer. Examples of materials having such characteristics include metallic oxides such as $SnO_2$, $In_2O_3$, $ZnO$, $CdO$, $CdSnO_4$, and ITO ($In_2O_3+SnO_2$). The fabrication method may be any one of the resistance heating vapor deposition, electron beam heating vapor deposition, sputtering, spraying or the like, which is appropriately selected as desired.

The passivation layer 107 for use in this invention is an insulating material for preventing defective portions having low resistance causing a shunt or short circuit from contacting the upper electrode 108 and the bus bar 109. Since the passivation layer 107 is laminated over the entire surface of the semiconductor layer, it must be made of a light transmissive material in order to not prevent the solar light from entering therein. Also, if the solar cell is used outdoors, it is required to have an excellent weatherproof quality and stability against heat, humidity, and light. Moreover, since the solar cell may be bent or impacted in some cases, mechanical strength is also required.

For such a material, a polymer resin is preferable, and specific examples thereof include polyester, a copolymer of ethylene and vinyl acetate, acrylic resin, epoxy resin, urethane, etc. The preferable molecular weight for the polymer resin is about ten thousand to twenty thousand in average molecular weight. The film thickness, which should be sufficient to retain the insulating properties and not lose the light transmittance, is appropriately selected from 1000° A to 100 $\mu$m depending on the material of the polymer resin, preferably from 1 $\mu$m to 50 $\mu$m, and more preferably from 5 $\mu$m to 20 $\mu$m. The method for laminating the polymer resin may be an ordinary method. For example, spin coating or dipping by dissolving the polymer resin in a solvent, coating with a roller by dissolving it with heat, depositing by electrolytic polymerization, depositing by electrocoating, and depositing by plasma pllymerization may be used, and can be appropriately selected, depending on various conditions such as the material of the polymer resin and its desired film thickness. From the standpoint of mass producibility, the dipping method, the roller coat method, and the electrocoating method are preferable. In particular, the electrocoating method is preferable because due to the ability of using a water soluble solvent, the treatment of waste liquid is simple and the film thickness can be easily controlled by controlling the electric current.

Figure 3A:
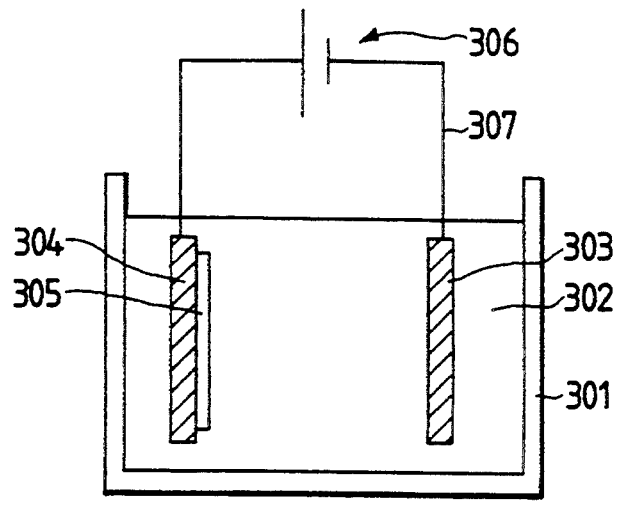
FIGS. 3A and 3B are schematic views illustrating an electrocoating apparatus.
Figure 3B:
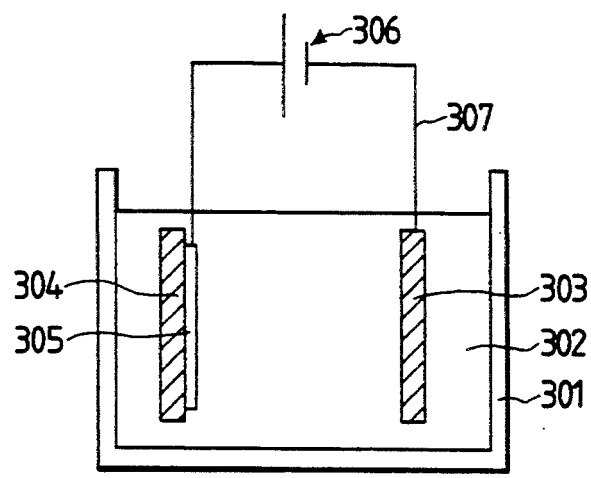

Such an electrocoating apparatus is as shown in FIG. 3A or 3B, for example. In FIGS. 3A and 3B, 301 is an electrocoating tank, 302 is an electrocoating liquid, 303 is a counter electrode, 304 is a substrate, 305 is a transparent electrode, 306 is a power source, and 307 is a conductive wire. In the electrocoating, a voltage can be applied to the substrate 304 of the solar cell. In some cases, a voltage may be applied by providing an appropriate terminal on the transparent electrode 106 (FIG. 3B). In the latter case, since the voltage is not applied to the inside of the solar cell, unnecessary electric current will not flow through the solar cell, so that the solar cell is not destroyed during the electrocoating process. Also, the electrocoating rate can be higher, and the electrocoating liquid can be conserved because the electrocoating is not applied on the back side of the substrate 304.

A commercially available electrocoating liquid 302 can be used, including anionic and cationic types which are selected as necessary because the polarity of the voltage applied to the substrate 304 is different.

The upper electrode 108 for use in this invention is a low resistance electrode for collecting the electric current flowing through the transparent electrode 106. An example of the electrode material is a conductive paste for which a binder of polymer resin, such as epoxy, polyester, and urethane, and a solvent of the binder are mixed at an appropriate ratio into a powdered conductive filler such as Ag, Pt, Cu, C, or the like, or their alloys to produce a paste. The resistivity is desirably $10^{-2}$ $\Omega$cm to $10^{-5}$ $\Omega$cm because a sufficient amount of current must flow during the plating, and for such a conductive paste, a commercially available paste can be appropriately used. Examples of commercially available pastes with silver filler and polyester binder include No. 5007 made by Dupont and No. FC-301CA made by Fujikura Kasei Co., Ltd. Examples of pastes with silver filler and epoxy binder include No. 84-ILM-1 and No. 959-1 made by Able Bond. Examples of pastes with silver filler and polyurethane binder include No. 3322 and No. 3320D made by Three Bond. An appropriate solvent may be added to such a conductive paste for the adjustment of viscosity.

Electrodes of such conductive paste can be fabricated with excellent producibility by using the conventional screen printing method. The screen printing method uses a conductive paste as the printing ink by using a screen in which a desired pattern is applied to a mesh made of nylon or stainless steel, the electrode width being about 50 $\mu$m at minimum. A preferable example of the printing machine is a commercially available printing machine such as Hk-4060 made by Tokai Seiki K.K. The conductive paste applied by the screen printing is generated in a drying furnace to dry the binder and volatilize the solvent.

In the present invention, it is necessary to select a material for the conductive paste in accordance with the material of the passivation layer 107. That is, since the passivation layer 107 is insulating or highly resistive, the ohmic contact between the upper electrode 108 and the transparent electrode 106 is not sufficient even if the upper electrode 108 is laminated on the passivation layer 107, and the solvent or monomer contained in the conductive paste will dissolve the passivation layer 107, causing the conductive filler to make contact with the transparent electrode 106, whereby the upper electrode 108 and the transparent electrode 106 are sufficiently contacted electrically. In this case, there is a possibility that the defective portion and the conductive filler may be contacted at the same time, but the degree of short circuit can be reduced because the binder left undissolved by the solvent and the passivation layer 107 covers the defective portion, thereby producing an appropriate resistance.

The shape and area of the upper electrode 108 are appropriately designed so as not to prevent the light from entering the semiconductor layer and to efficiently collect the electric current. That is, the covered area is minimized so as not to shade the incident light, and the electrical conductivity is made as high as possible not to be resistive for the current. The bus bar 109 for use in this invention is an electrode for further collecting the electric current flowing through the upper electrode 108. Examples of the electrode material include a metal such as Ag, Pt, Cu, or the like, C, and their alloys, in which the wire- or foil-like electrode is bonded, or conductive paste such as for the upper electrode 108 may be used. As the foil-like electrode, for example, a copper foil or a tin plated copper foil is used, and in some cases an adhesive may be applied. A commercially available example thereof is No. 1345 by 3M. Since a great amount of electric current will flow through the bus bar, it needs to have a larger cross section and thus a lower resistivity than the collector electrode. The solar cell thus fabricated is modularized by encapsulation by a well known conventional method to provide better weatherproofing for outdoor use.

The preferred material for the encapsulation is preferably EVA (ethylene vinylacetate) or the like by virtue of its adhesiveness with the solar cell, and its weatherproofing and buffering effects. To improve the moisture or damage proofing, a fluorine-type resin is used as a surface protective layer. Examples of the fluorine-type resin include TFE (Teflon made by Dupont) which is a polymer of 4-fluoroethylene, ETFE (Tefzel made by Dupont) which is a copolymer of 4-fluoroethylene and ethylene, polyvinyl fluoride (Tedlar made by Dupont), and Polychlorofluoroethylene CTFE (Neoflon made by Daikin Industries). The addition of an ultraviolet light absorbent to such a resin may improve the weatherproofing properties.

Figure 4:
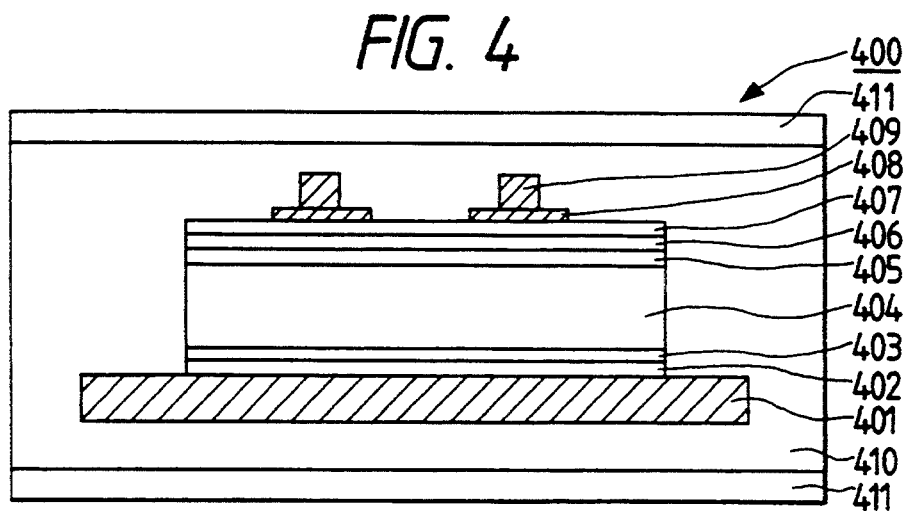
FIG. 4 is a schematic view illustrating a solar cell module according to the present invention.

Laminating of such a resin on the solar cell substrate is accomplished by heating and pressure bonding it by using a commercially available apparatus such as a vacuum laminator (VTL-100 type made by Nippon Physitec Equipment). The structure of a solar cell module of this invention thus fabricated is as shown in FIG. 4. In the figure, 400 is a solar cell module main body, 401 is a substrate, 402 is a lower electrodes 403 is an n-type semiconductor layer, 404 is an i layer, 405 is a p-type layer, 406 is a transparent electrode, 407 is a passivation layer, 408 is an upper electrode, 409 is a bus bar, 410 is an adhesive layers and 411 is a surface protective layer.

As described above, by providing the passivation layer made of a polymer resin between the semiconductor layer of solar cell and the upper electrode and the upper electrode provided on the semiconductor layer, and forming the upper electrode using a conductive pasted the defective portions of the semiconductor layer causing the shunt or short circuit can be prevented from making contact with the upper electrode. As a result, the loss of photoelectric current owing to the short circuit is prevented, whereby a solar cell having a high conversion efficiency can be obtained. That is, when the conductive paste is applied, a solvent contained in the paste or a monomer of polymer resin binder will partially dissolve the passivation layer, causing the conductive filler to place the transparent electrode and the upper electrode into electrical contact with each other, while at the same time the passivation layer and the polymer resin binder cover the defective portion(s), so that the short circuit(s) can be suppressed.

The adhesion of the passivation layer as formed above to the upper electrode, as well as its adhesion to the encapsulation material are high, whereby the durability of the solar cell is greatly improved. Further, in the configuration of the present invention as described above, the patterning process for the passivation is unnecessary, resulting in a simplified fabrication process, whereby the solar cell can be fabricated at higher yield.

Figure 2A:
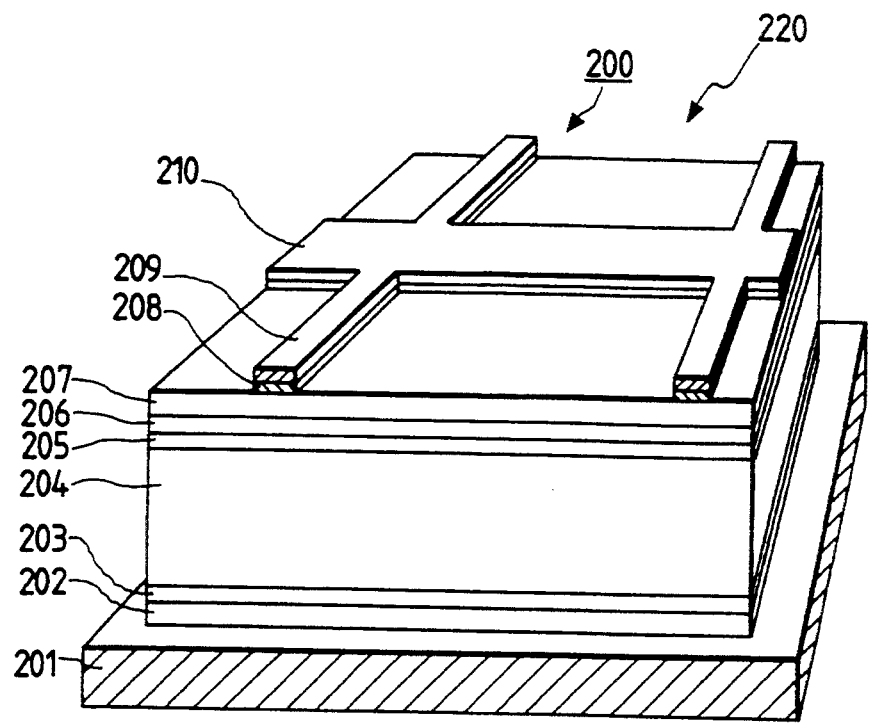
FIGS. 2A to 2D are perspective views schematically illustrating the constitution of another solar cell according to the present invention.
Figure 2B:
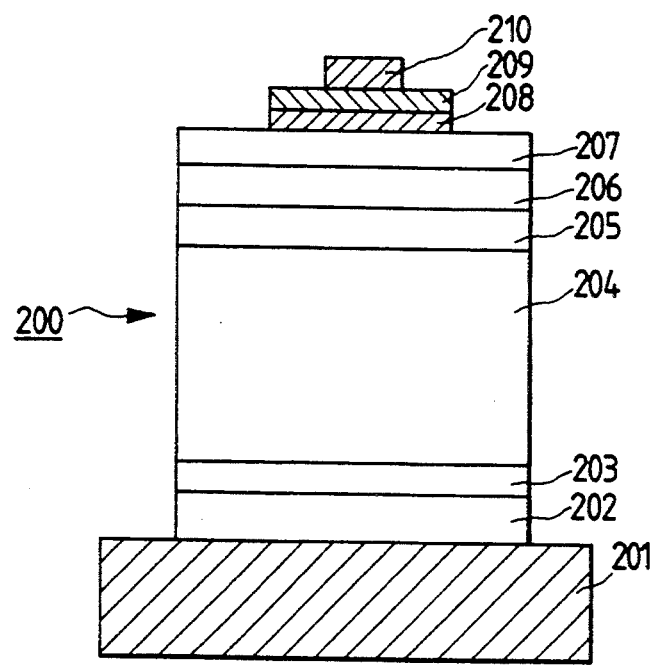
Figure 2C:
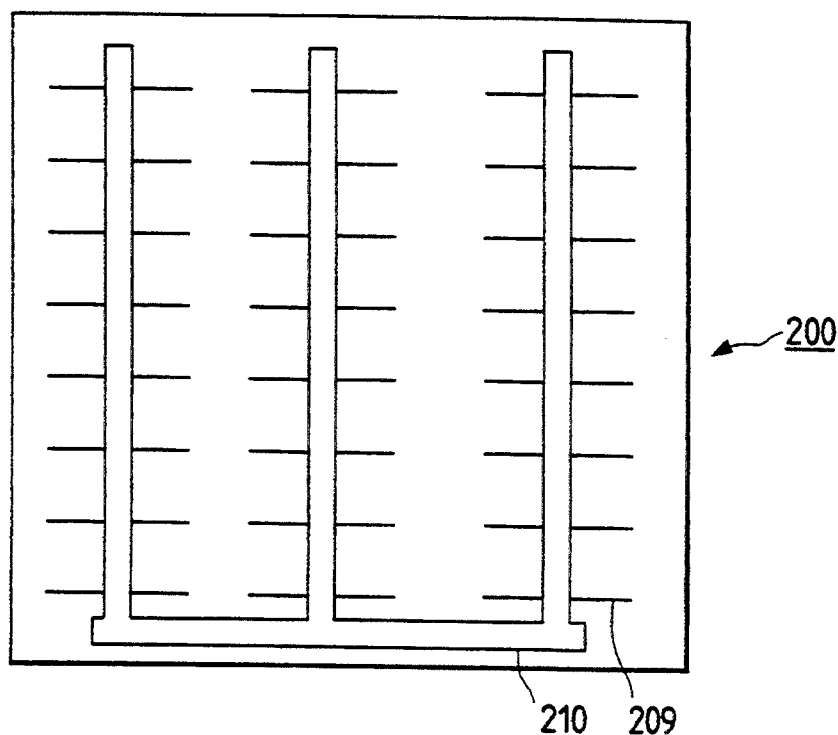
Figure 2D:
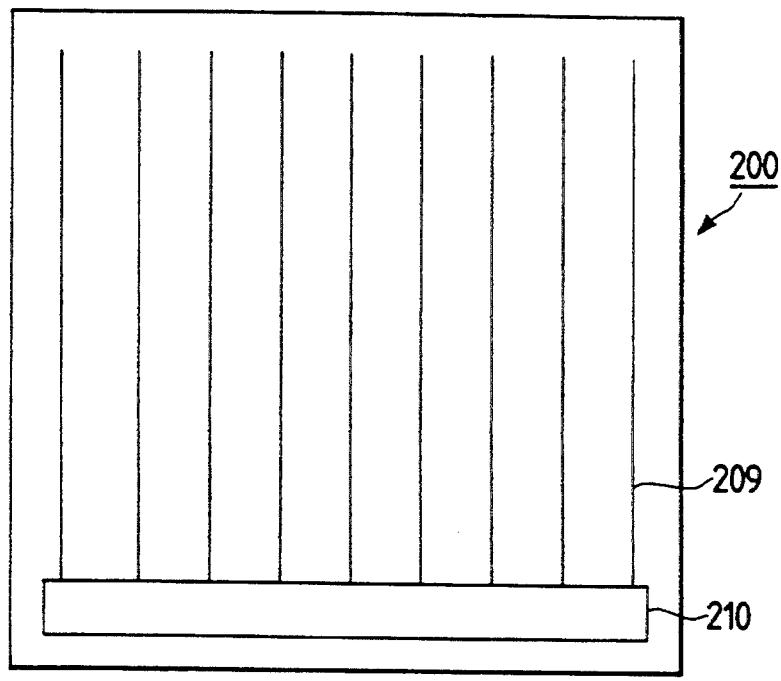

FIG. 2A shows schematically the constitution of another example of a pin-type amorphous solar cell according to the present invention. FIG. 2B is a view representing the cross section of FIG. 2A. FIGS. 2C–2D are top views of FIG. 2A.

FIG. 2A shows a solar cell in which light 220 is incident from above. In the figure, 200 is a solar cell main body, 201 is a substrate, 202 is a lower electrode, 203 is an n-type semiconductor layer, 204 is an i layer, 205 is a p-type layer, 206 is a transparent electrode, 207 is a passivation layer, 208 is an upper electrode, 209 is a collector electrode, and 210 is a bus bar.

The components of FIG. 2 up to the upper electrode can be formed of the same materials as the corresponding components of FIG. 1 up to the upper electrode.

The passivation layer 207 in this embodiment serves as a protective layer to protect the solar cell from being exposed to the plating liquid in forming the collector electrode 209 by electroplating, and as a mask to prevent the electrode from being formed on this portion.

Also, the upper electrode 208 in this invention serves as a pattern in forming the collector electrode 209, and in the process, is fabricated prior to the formation of the collector electrode 209, but fulfills the same function as that of the collector electrode 209.

The shape and area of the collector electrode 209 of this invention are optimally designed based on the resistivity or the thickness of the electrode material, the amount of electric current produced by the solar cell, and the sheet resistance of the transparent electrode. Also, it is designed to have a minimum area so as not to shade the incident light and not to be resistive for the current.

The collector electrode 209 of this invention is preferably fabricated by electroplating with a metal. Examples of such a metal include copper, nickel, silver, gold, aluminum, chromium or the like, and their mixtures.

Figure 5A:
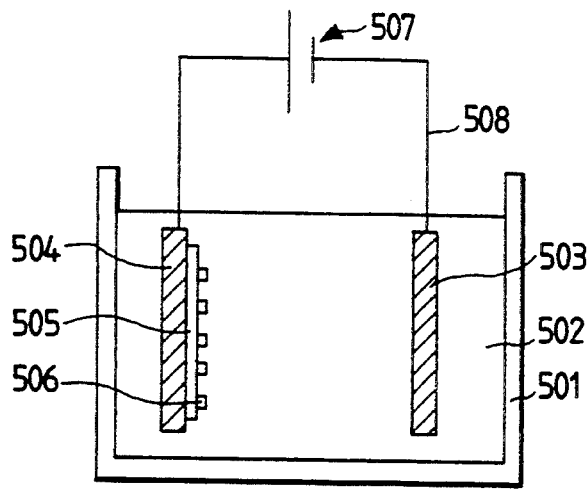
FIGS. 5A and 5B are schematic views illustrating a plating apparatus according to the present invention.

When electroplated with such a metal, the plating bath may be adjusted in accordance with the deposited metals and is formulated by a conventionally known method for which a commercially available plating liquid can be used. The plating apparatus is exemplified in FIGS. 5A and 5S. In these figures, 501 is a plating tank, 502 is a plating liquid, 503 is a counter electrode, 504 is a substrate, 505 is all layers up to the passivation layer 207 (FIG. 25), 506 is an upper electrode, 507 is a power source, and 508 is a conductive wire, In plating, a negative voltage can be applied to the substrate 504 of the solar cell, as shown in FIG. 5A, or in some cases a negative voltage may be applied to the upper electrode 506, as shown in FIG. 5S. In the latter case, since the voltage is not applied to the inside of the solar cell, unnecessary electric current will not flow through the solar cell, so that the solar cell is not destroyed during the electrocoating process. Also, the electrocoating rate can be made faster, and the electrocoating liquid can be conserved because the electrocoating is not applied on the back side of the substrate 504.

The bus bar 210 for use in this invention is an electrode for further collecting the electric current flowing through the collector electrode 209. Examples of the electrode material include a metal such as Ag, Pt, and Cu, C, and their alloys. The bus bar may be fabricated by bonding a wire- or foil-like electrode, or by the use of a conductive paste like that of the upper electrode 208, or by electroplating, like the collector electrode 209. As the foil-like electrode, for example, a copper foil or a tin plated copper foil may be used, and in some cases an adhesive is applied. Commercially available No, 1345 by 3M, is used for such an electrode, and it needs to have a larger cross section to provide a lower resistivity than the collector electrode 209 because a great amount of electric current will flow through the bus bar 210.

Figure 6:
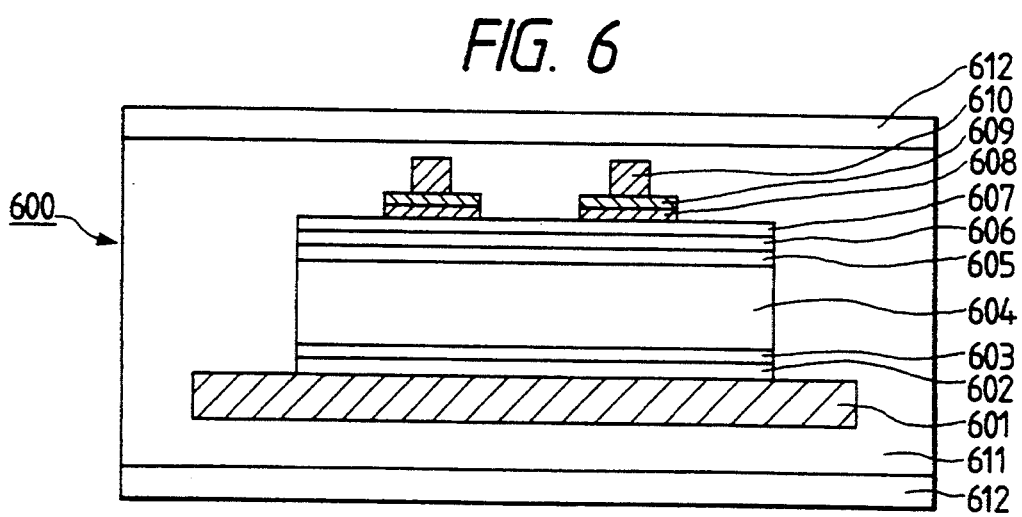
FIG. 6 is a schematic view illustrating another solar cell module according to the present invention.

As in FIG. 4, the module structure of a solar cell formed with the collector electrode thus fabricated according to the present invention is shown in FIG. 6. In the figure, 600 is a solar cell module main body, 601 is a substrate, 602 is a lower electrode, 603 is an n-type semiconductor layer, 604 is an i layers 605 is a p-type layer, 606 is a transparent layer, 607 is a passivation layer, 608 is an upper electrode, 609 is a collector electrode, 610 is a bus bar, 611 is an adhesive layer, and 612 is a surface protective layer.

In the following, the present invention will be described in detail by way of example, but the present invention is not limited to such examples.

EXAMPLE 1

A solar cell having a layer configuration as shown in FIG. 1A was fabricated in the following manner.

First, a SUS430BA substrate 101 (30 cm square, 0.1 mm thick), sufficiently degreased and cleaned, was placed in a DC sputter apparatus (not shown) to form a lower electrode 102 by depositing Cr 2000 Å thick. The substrate 101 was then removed and placed in RF plasma CVD film formation apparatus (not shown), after which the semiconductor layer was deposited on the lower electrode 102 in the order of n layer 103, i layer 104, and p layer 105. Thereafter, it was placed in a resistance heating vapor deposition apparatus (not shown) to deposit In and Sn by resistance heating, whereby a 700 Å thick transparent conductive film 106 also providing an anti-reflection effect was deposited. Then, the passivation layer 107 was deposited using an electrocoating apparatus of FIGS. 3A and 3B in the following procedure.

10 liters of deionized water were filled in an electrocoating tank 301, and 2 liters of acrylic anionic electrocoating paint (Acrylclear A-7X made by Uemura Industries) were added thereto while agitating at a rate of 500 rpm by means of an agitator (not shown). After the continuous agitation for one hour, it was left stationary for two days to permit aging, whereby an electrocoating liquid 302 was formed. Then, the substrate 304 was placed in the electrocoating tank 301, and a voltage of 30V was applied to the counter electrode 303 so that the substrate 304 was biassed negatively for two minutes. After the passivation layer 107 was deposited on the transparent electrode 106, the substrate 304 was removed from the electrocoating tank and washed with deionized water, and then placed in a thermostat and held at 150° C. for five minutes to dry out the passivation layer 107. The measurement of this coating thickness by profilometer indicated 5 $\mu$m. The layer thus obtained was insulating, the resistivity of which was too great to be measured by a micro ammeter (Model 4140B made by HP). Moreover, measurement of the transmittance of this layer deposited on the specular surface of a silver plate by reflection measurement indicated 90% transmittance or greater.

Then, the substrate 304 was installed in a screen printing machine (HK-4060 made by Tokai Seiki K.K.) (not shown), and the upper electrodes 108, 300 $\mu$m wide and 8 cm long, were printed at an interval of 1 cm. In this case, the conductive paste used had a composition of 70 parts of Ag filler, 30 parts of polyester binder (volume ratio), and 5 parts of ethyl acetate as the solvent. After the printing, the substrate 304 was placed in the thermostat and held at 150° C. for five minutes to cure the conductive paste. Moreover, the bus bar 109 of a copper foil (No. 1345 made by 3M) having a width of 5 mm with an adhesive applied thereon was bonded as shown in FIG. 1C to become electrically conductive, whereby a single cell 30 cm was fabricated.

Then, the encapsulation of this sample was made in the following way. EVA (ethylene vinyl acetate) was laminated over and under the substrate 304, and PTFE (polytetrafluoroethylene) resin (Tefzel made by Dupont) was further laminated over and under the substrate 304 as once laminated, and then the substrate 304 was placed into a vacuum laminator (VTL-100 type made by Nippon Physitec Equipment K.K.) and held at 150° C. for sixty minutes to make the vacuum lamination. The obtained sample was designated No. 1—1.

The initial characteristics of the obtained sample were measured in the following way. First, the current-/voltage characteristics in the dark state were measured in which the shunt resistance was measured from an inclination near the origin. Next, each sample was irradiated by the solar light spectrum of AM 1.5 at an intensity of 100 mW/cm$^2$, using a pseudo solar light source (thereinafter called a simulator) with a xenon lamp, whereby the solar cell characteristics were measured to obtain the conversion efficiently. The series resistance was obtained from the current/voltage curve thus obtained.

In order to evaluate differences based on the composition of the conductive paste used for the upper electrode 108, the films up to the passivation layer 107 were formed on another substrate 304 by the abovementioned method, and the composition of the conductive paste was changed in various ways to form the upper electrode 108. Subsequent processes were performed as in the above method, and the encapsulation was made, whereby the evaluation was performed as above.

Samples ranging from sample No. 1-2 to No. 1-4 have the same binder as the sample No. 1—1 with the quantity of solvent varied, and the composition and evaluation results are shown in Table 1. Samples ranging from sample No. 1-5 to No. 1-8 have polyurethane as the binder and methyl ethyl ketone (MEK) as the solvent with the quantity of solvent varied, and the results are shown in Table 2. Samples ranging from sample No. 1-9 to No. 1—12 have epoxy as the binder and MEK as the solvent with the quantity of solvent varied, and the results are shown in Table 3.

As shown in Tables 1 and 2, the solar cell characteristics greatly vary depending on the quantity of solvent, that is, the more the solvent, the smaller the shunt resistance and the series resistance, and vice versa. This is believed due to the fact that when the amount of solvent is small, it is difficult to make Ag contact the transparent electrode 106 by dissolving the passivation layer 107, and the series resistance increases, while the leakage current can be prevented, whereby the shunt resistance becomes large. On the other hand, when the amount of solvent is large, the passivation layer 107 is dissolved too much, resulting in a large contact area between Ag and the transparent electrode 106, whereby the passivation effects are almost lost. This is believed due to the fact that the shunt resistance decreases with the increase in the leakage current, with the contact resistance between the upper electrode 108 and the transparent electrode 106 being small, so that the series resistance decreases.

On the other hand, in connection with Table 3, even with no solvent, an excellent conversion efficiency can be obtained, and the shunt resistance and the series resistance decrease with increasing amount of solvent, which is believed due to the fact that the monomer within the binder has a dissolving effect on the passivation layer.

For the samples No. 1-3, No. 1-7 and No. 1—10 which had excellent initial characteristics among these samples, the dispersion in the initial characteristics and the durability characteristic were evaluated in the following way. First, with the above method, the samples corresponding to No. 1-3, No. 1-7 and No. 1—10 were each fabricated in ten sheets, and designated No. 1-20 to No. 1-29, No. 1-30 to No. 1-39, and No. 1-40 to No, 1-49, respectively. The initial characteristics were measured and the results are shown in Table 4. From Table 4, it can be seen that the dispersion in the characteristics is small and the yield is excellent.

Next, the durability characteristics were tested based on a temperature/humidity cycle test A-2, the durability test method for crystalline solar cell modules according to the Japanese Industrial Standard C8917.

First, the sample was placed into a thermohygrostat which can control the temperature and the humidity, and a test cycle of changing the temperature from $-40°$ C. to $+85°$ C. (with a relative humidity of 85%) was repeated ten times. The solar cell characteristics of the sample were measured after termination of the test, using the shunt resistance and the simulator in the dark state in the same way as the measurement of initial characteristics. The results are shown in Table 4.

As clearly seen from Table 4, no degradation after the durability test was seen, and an excellent passivation effect was provided. No exfoliation of the encapsulation resin from the substrate was seen, and the passivation layer 107 had excellent adhesion.

From the above results, it can be found that the solar cell of the present invention formed by the solar cell fabrication method of the present invention has an excellent yield, superior durability, and high reliability.

TABLE 1

| Sample No. | Composition of Conductive Paste | | Initial Characteristics of Solar Cell | | |
|---|---|---|---|---|---|
| | | | Conversion Efficiency | Shunt Resistance | Series Resistance |
| No. 1-1 | Ag<br>Polyester<br>Ehthyl acetate | 70 parts<br>30 parts<br>5 parts | 3.5% | 1000KΩ cm$^2$ | 50Ω cm$^2$ |
| No. 1-2 | Ag<br>Polyester<br>Ethyl acetate | 70 parts<br>30 parts<br>10 parts | 4.8% | 250KΩ cm$^2$ | 20Ω cm$^2$ |
| No. 1-3 | Ag<br>Polyester<br>Ethyl acetate | 70 parts<br>30 parts<br>20 parts | 6.5% | 50KΩ cm$^2$ | 10Ω cm$^2$ |
| No. 1-4 | Ag<br>Polyester<br>Ethyl acetate | 70 parts<br>30 parts<br>40 parts | 4.5% | 10KΩ cm$^2$ | 5Ω cm$^2$ |

TABLE 2

| Sample No. | Composition of Conductive Paste | | Initial Characteristics of Solar Cell | | |
|---|---|---|---|---|---|
| | | | Conversion Efficiency | Shunt Resistance | Series Resistance |
| No. 1-5 | Ag<br>Polyurethane<br>MEK | 70 parts<br>30 parts<br>5 parts | 4.5% | 800KΩ cm$^2$ | 30Ω cm$^2$ |
| No. 1-6 | Ag<br>Polyurethane<br>MEK | 70 parts<br>30 parts<br>10 parts | 5.1% | 500KΩ cm$^2$ | 15Ω cm$^2$ |
| No. 1-7 | Ag<br>Polyurethane<br>MEK | 70 parts<br>30 parts<br>20 parts | 6.1% | 35KΩ cm$^2$ | 10Ω cm$^2$ |
| No. 1-8 | Ag<br>Polyurethane<br>MEK | 70 parts<br>30 parts<br>40 parts | 5.1% | 10KΩ cm$^2$ | 5Ω cm$^2$ |

TABLE 3

| Sample No. | Composition of Conductive Paste | | Initial Characteristics of Solar Cell | | |
|---|---|---|---|---|---|
| | | | Conversion Efficiency | Shunt Resistance | Series Resistance |
| No. 1-9 | Ag<br>Epoxy<br>MEK | 70 parts<br>30 parts<br>5 parts | 5.7% | 120KΩ cm$^2$ | 10Ω cm$^2$ |
| No. 1-10 | Ag<br>Epoxy | 70 parts<br>30 parts | 6.2% | 50KΩ cm$^2$ | 8Ω cm$^2$ |

TABLE 3-continued

| Sample No. | Composition of Conductive Paste | | Initial Characteristics of Solar Cell | | |
|---|---|---|---|---|---|
| | | | Conversion Efficiency | Shunt Resistance | Series Resistance |
| No. 1-11 | MEK | 10 parts | 5.5% | 35KΩ cm² | 8Ω cm² |
| | Ag | 70 parts | | | |
| | Epoxy | 30 parts | | | |
| | MEK | 20 parts | | | |
| No. 1-12 | Ag | 70 parts | 3.5% | 10KΩ cm² | 5Ω cm² |
| | Epoxy | 30 parts | | | |
| | MEK | 40 parts | | | |

TABLE 4

| Sample No. | Composition of Conductive Paste | | Initial Characteristics of Solar Cell | | | | | |
|---|---|---|---|---|---|---|---|---|
| | | | Conversion Efficiency | | Shunt Resistance | | Series Resistance | |
| | | | Initial [%] | Degradation ratio after durability test [%] | Initial [KΩ cm²] | Degradation ratio after durability test [%] | Initial [Ω cm²] | Degradation ratio after durability test [%] |
| No. 1-20 ~ No. 1-29 | Ag | 70 parts | 6.2 ± 0.5 | 2 ± 0.5 | 200 ± 5 | 20 ± 5 | 6 ± 2 | 1 ± 0.2 |
| | Polyester | 30 parts | | | | | | |
| | Ethyl acetate | 20 parts | | | | | | |
| No. 1-30 ~ No. 1-39 | Ag | 70 parts | 6.4 ± 0.3 | 3 ± 0.5 | 300 ± 20 | 15 ± 3 | 5 ± 2 | 2 ± 0.3 |
| | Polyurethane | 30 parts | | | | | | |
| | MEK | 20 parts | | | | | | |
| No. 1-40 ~ No. 1-49 | Ag | 70 parts | 6.5 ± 0.6 | 2 ± 0.5 | 500 ± 5 | 10 ± 5 | 5 ± 2 | 1 ± 0.4 |
| | Epoxy | 30 parts | | | | | | |
| | MEK | 20 parts | | | | | | |

COMPARATIVE EXAMPLE 1

Figure 7A:
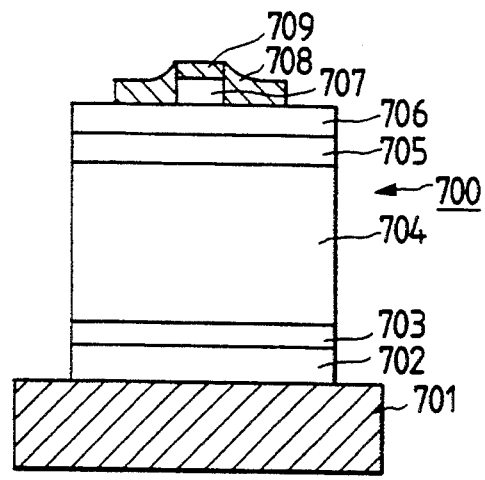
FIGS. 7A to 7C are views schematically illustrating the constitution of a conventional solar cell.

A conventional solar cell having a layer configuration as shown in FIG. 7A was fabricated in the following way.

In the same way as example 1, a transparent electrode 706 was formed on a substrate 701. Then, a passivation layer 707 was fabricated by electrocoating in the same way as the example 1. The difference from example 1 was that the passivation layer 708 was patterned. Further, in the same way as the example 1, an upper electrode 708, which was a collector electrode, was printed. In this case, the conductive paste was PC301CA made by Fujikura Kasei Co., Ltd. A copper foil bus bar 709 with an adhesive applied thereon was laminated on the passivation layer 707, whereby a single cell 30 cm square was fabricated.

With the above fabrication method, ten sheets of samples were fabricated. Then, the encapsulation of these samples was performed in the same way as in example 1. The obtained samples were designated R-1 to R-10.

The initial characteristics of the obtained samples were such that the conversion efficiency was 5.2%±2% and the shunt resistance was in a range of 5K·Ωcm² to 150kΩcm²; the dispersion was larger and the shunt resistance was greater than in example 1.

Next, the durability characteristics of these samples were evaluated in the same way as in example 1. The measurement of the solar cell characteristics of the samples after termination of the humidity/temperature cycle test indicated an average value of 90% relative to the initial value, and thus the occurrence of a significant degradation was indicated. Also, the measurement of shunt resistances R-1 to R-10 indicated an average reduction of 50%.

Presence of shunt portions in the sample was confirmed in the following way. A reverse bias of 1.5 volts was applied to the sample. In the shunt portions, the electric current will flow and generate heat, while in the normal portion, the electric current will not flow due to the reverse bias, and therefore will not generate heat. Observing the sample surface in this state with an infrared camera, a heat generating portion was detected, and it could be found that the sample was shunted under the collector electrode. Also, investigation of the series resistance before and after the temperature/humidity cycle test indicated that partial exfoliation of the encapsulation resin from the substrate occurred.

COMPARATIVE EXAMPLE 2

Figure 7B:
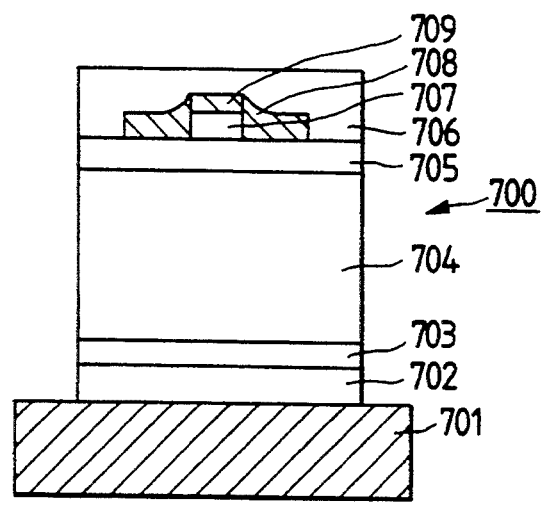
Figure 7C:
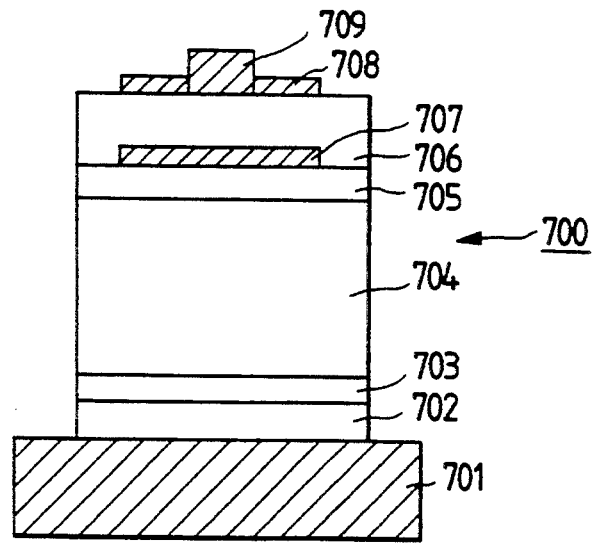

A conventional solar cell having a passivation layer as shown in FIG. 7B was fabricated in the following way.

In the same way as in Example 1, layers up to p layer 705 were formed on a substrate 701. Then, a positive pattern mask made of polyester film having the same shape as the bus bar 709 was laminated on the p layer 705, and a passivation layer 707 was formed by electrocoating in the same way as in the example 1, whereby the passivation layer 707 was formed on the p layer 705 in the same pattern as that of the bus bar 709. Then, in the same way as the comparative example 1, an upper electrode 708, which was a collector electrode, was printed by a screen printing machine. Further, a copper foil bus bar 709 with an adhesive applied thereon was laminated, after which a transparent electrode 706 was deposited, and a single cell 30 cm square was fabricated. Ten sheets of samples were fabricated in the same way.

Then, the encapsulation of these samples was performed in the same way as in example 1. The obtained samples were designated R-11 to R-20. The initial characteristics of the obtained samples were such that the conversion efficiency was 5.8%+1.5% and the shunt resistance was 15KΩcm² to 200KΩcm²; the dispersion was larger and the shunt was greater than in example 1.

The series resistance was in a range of 10Ωcm² to 30Ω cm².

Next, the durability characteristics of these samples were evaluated in the same way as in example 1. The measurement of the solar cell characteristics of the samples after termination of the humidity/temperature cycle test indicated an average value of 90% relative to the initial value, and thus the occurrence of a significant degradation was indicated. Also, the measurement of shunt resistances of the samples indicated an average reduction of about 30%, whereby the presence of shunts was indicated.

By observing the shunt portion of this sample with an infrared camera, as in the comparative example 1, it could be found that the sample was shunted under the collector electrode.

EXAMPLE 2

By depositing a passivation layer 107 with a cationic electrocoating resin, a solar cell having a layer configuration as shown in FIG. 1A was fabricated in substantially the same way as in the example 1.

First, layers up to the transparent electrode 106 were formed on the substrate 101 in the same way as in example 1. Then, the passivation layer 107 was deposited by the following cationic electrocoating procedure.

10 liters of deionized water was poured into an electrocoating tank 301 of FIG. 3A, and 2 liters of epoxy-type cationic electrocoating paint (AUED800-FH made by Uemura Industries K.K.) was added hereto while agitating at a rate of 1000 rpm with an agitator (not shown). After continuous agitation for one hour, it was left stationary for two days to permit aging. Then, the substrate 304 was placed in the electrocoating tank 301, and a voltage of 100V was applied to the counter electrode 302 so that the substrate 304 was positively biased, and held thereat for two minutes. After the passivation layer 107 was deposited on the transparent electrode 106, the substrate 304 was taken out from the electrocoating tank and washed with deionized water, and then placed in a thermostat and held at 175° C. for twenty minutes to dry the passivation layer 107. The measurement of coating thickness by profilometer indicated 10 μm.

Then, using a conductive paste having a composition containing 60 parts of Pd filler, 40 parts of epoxy (volume ratio), and 15 parts of MEK as the solvent, the upper electrode was printed, and a copper foil with an adhesive applied thereon was laminated on the bus bar 109, whereby a single cell 30 cm square was fabricated. Ten sheets of the above samples were fabricated.

Further, encapsulation of these samples was made in the same way as in example 1. The obtained samples were designated No. 2-1 to No. 2-10. The initial characteristics of the obtained samples showed 6.1±0.5% and a shunt resistance of 300KΩcm² to 500KΩcm², which was excellent and with a small dispersion.

Next, the durability characteristics of these samples were evaluated in the same way as in example 1. The measurement of the solar cell characteristics of the samples after termination of the humidity/temperature cycle test indicated an average value of 97% relative to the initial conversion efficiency, and thus no occurrence of a significant degradation was indicated. Also, the measurement of the shunt resistances indicated an average reduction of about 10%, with no significant degradation. No exfoliation of the encapsulation resin from the substrate was seen, and the passivation layer 107 had excellent adhesion.

From the above results the solar cell of the present invention using the solar cell fabrication method of the present invention had an excellent yield, good characteristics, and superior durability.

EXAMPLE 3

By using a dipping coat method as the fabrication method of a passivation layer 107, a solar cell having a layer configuration as shown in FIG. 1A was fabricated in the following way.

First, layers up to the transparent electrode layer 106 were formed on the substrate 101 in the same way as in example 1. Then, polyester resin having an average molecular weight of ten thousand to twenty thousands was dissolved in MEK. The substrate 101 was placed in this bath and then removed and held in a thermostat at 70° C. for five minutes to dry the solvent and form the passivation layer 107. The thickness of the passivation layer 107 was 5 μm.

Then, in the same way as in example 1, the upper electrode 108 was printed, and a copper foil with an adhesive applied thereon was laminated on the bus bar 109, whereby a single cell 30 cm square was fabricated. Ten sheets of the samples were fabricated in the same way.

Then, the encapsulation of these samples was made in the same way as in example 1. The obtained samples were designated No. 3-1 to No. 3-10. The initial characteristic of the obtained samples showed 6.3%±07.% and a shunt resistance of 100KΩcm² to 300KΩcm², which showed excellent characteristics with a small dispersion.

Next, the durability characteristics of these samples were evaluated in the same way as in example 1. The measurement of the solar cell characteristics of the samples after termination of the humidity/temperature cycle test indicated an average value of 98% relative to the initial conversion efficiency, and thus no occurrence of a significant degradation was indicated. Also, the measurement of the shunt resistances indicated an average reduction of about 10%, with no significant degradation. No exfoliation of the encapsulation resin from the substrate was seen, and the passivation layer 107 had excellent adhesion.

From the above results, the solar cells of the present invention using the solar cell fabrication method of the present invention had an excellent yield, good characteristics, and superior durability.

EXAMPLE 4

A solar cell having a layer configuration as shown in FIG. 2A was fabricated in the following way.

First, a SUS430BA substrate 201 (30 cm square, 0.1 mm thick), sufficiently degreased and cleaned, was placed in a DC sputter apparatus (not shown) to form a lower electrode 202 by depositing Cr 2000 Å thick. The substrate 201 was taken out and placed in an RF plasma CVD film formation apparatus (not shown) for the deposition, in order, of an n layer 203, i layer 204, and p layer 205. Thereafter, it was placed in a resistance heating vapor deposition apparatus (not shown) to deposit an alloy of In and Sn by resistance heating, whereby a transparent electrode 206 also serving as an anti-reflection layer was deposited 700 Å thick.

Then, after the passivation layer 207 was deposited using an acrylic anionic electrocoating paint (Acrylclear A-7X made by Uemura Industries), the substrate 201 was installed in a screen printing machine (HK-4060 made by Tokai Seiki) (not shown) to print upper electrodes 208, 100 μm wide and 8 cm long at an interval of 1 cm. In this case, the conductive paste had a composition containing 08 parts of Ag filler, 30 parts of polyester binder (volume ratio), and 20 parts of ethyl acetate as the solvent. After printing, the substrate 201 was placed in a thermostat and held at 150° C. for five minutes to cure the conductive paste. Next, in the following way, using a plating tank of FIG. 5A, a collector electrode 209 of nickel was formed by electroplating.

First, the substrate 504 was immersed in a neutral sulfamic acid solution for five seconds, and then immersed in a plating tank 501 filled with a plating liquid 502 held at a temperature of 50° C. and pH4, which liquid was a commercially available electroplating liquid N-100ES made by High Purity Chemicals K.K. Thereafter, using a power source 507, a voltage of about −1 volt was applied to the substrate 504, and plating was conducted at a current density of 20 mA/cm$^2$. Under these conditions, nickel was deposited 2 μm thick only on the upper electrode 506, and was not deposited on other portions.

Next, a bus bar 210 made of a copper foil having a width of 5 mm with an adhesive applied thereon was bonded as shown in FIG. 2C, whereby a single cell 30 cm square was fabricated. Ten sheets of the samples were fabricated in the same way.

Then, the encapsulation of these samples was made in the following way. EVA (ethylene vinyl acetane) was laminated over and under the substrate 201, and further a fluororesin film ETFE (ethylene tetrafluoroethylene) (Tefzel made by Dupont) was laminated thereon. Then the substrate 304 was placed into a vacuum laminator and held at 150° C. for sixty minutes to make the vacuum lamination.

The initial characteristics of the obtained samples were measured in the following way. First, the current-/voltage characteristics of the obtained samples in the dark state were measured. The shunt resistance was measured form the inclination near the origin, so that the shunt resistance was in a range of 300KΩcm$^2$ to 500KΩcm$_2$, which was an excellent characteristic with a small dispersion. Next, each sample was irradiated by the solar light spectrum of AM 1.5 at an intensity of 100 mw/cm$^2$, using a pseudo solar light source (thereinafter called a simulator) with a xenon lamp, whereby the solar cell characteristics were measured to obtain the conversion efficiency. The conversion efficiency was in a range of 6.1%±0.5% which was an excellent characteristic with a small dispersion. The series resistance was obtained from a current/voltage curve thus obtained, so that the series resistance was 5Ωcm$^2$ on average, which as an excellent characteristic with a low resistance of the collector electrode 209.

Next, the durability characteristic was tested based on a temperature/humidity cycle test A-2 and the durability test method for crystalline solar cell modules according to the Japanese Industrial standard C8917.

First, the sample was placed into a thermohygrostat which can control the temperature and the humidity, and a test cycle of changing the temperature from −40° C. to 85° C. (with a relative humidity of 85%) was repeated ten times. For the samples after termination of the test, the solar cell characteristics were measured, using a simulator in the sam way as the measurement of initial characteristics, which were on average 98% of the initial conversion efficiency with no significant degradation. Also, the measurement of shunt resistance indicated a reduction of about 10% on average, with no significant degradation. No exfoliation of the encapsulation resin from the substrate was seen, and the passivation layer 207 had an excellent adhesion effect.

From the above results, the solar cells using the solar cell fabrication method of the present invention had an excellent yield, good characteristics, and superior durability.

COMPARATIVE EXAMPLE 3

Another conventional solar cell having a layer configuration as shown in FIG. 7A was fabricated in the following way.

In the same way as in the example 4, layers up to the transparent electrode 706 were formed on a substrate 701. Then, a collector electrode 708 was printed in the same way as in example 4. A copper foil bus bar 709 with an adhesive applied thereon was laminated, whereby a single cell 30 cm square was fabricated.

Then, the encapsulation of this sample was performed in the same way as in example 4. The initial characteristics of the obtained sample were such that the conversion efficiency was 5.2%, the shunt resistance was 5KΩcm$^2$, and the series resistance was 15Ωcm$^2$. It is believed that since the series resistance was higher than in example 4, the conversion efficiency was lower.

Next, the durability characteristics of this sample were evaluated in the same way as in example 4.

The measurement of the solar cell characteristics of the sample after termination of the humidity/temperature cycle test indicated an average value of 90% relative to the initial value, and thus the occurrence of a significant degradation was indicated. Also, the shunt resistance was about 10KΩ cm$^2$ and the shunt was observed.

The shunt portion of this sample was confirmed in the following way. A reverse bias of 1.5 volts was applied to the sample. In the shunt portion, electric current will flow and generate heat, while in the normal portion, electric current will not flow due to the reverse bias, and therefore will not generate heat. Observing the sample surface in this state with an infrared camera, the heat generating portion was detected, and it could be found that the sample was shunted under the collector electrode.

COMPARATIVE EXAMPLE 4

A conventional solar cell as shown in FIG. 7A was fabricated in the following way be a conventional plating method. In the same way as in example 4, layers up to the transparent electrode 706 were formed on a substrate 701. Then, a positive pattern mask made of a polyester film having the same shape as the bus bar 709 was laminated on the transparent electrode 706, and a resist layer was laminated by spin coating. Then, nickel was plated to form a collector electrode 708 in the same way as in example 4. Further, a copper foil bus bar 709 with an adhesive applied thereon was laminated, and a single cell 30 cm square was fabricated. Ten sheets of samples were fabricated in the above-described way.

Then, encapsulation of these samples was performed in the same way as in the example 4. The initial characteristic of the obtained samples was 6.1%±3% with a large dispersion. This is believed due to the fact that the shunt resistance of the sample having poor characteristic is lower, and the collector electrode 708 formed of nickel was placed into contact with a defective portion, thereby causing a short-circuit. The shunt resistance was 200Ωcm² to 15KΩcm².

Next, the durability characteristics of these samples were evaluated in the same way as in example 4. The measurement of the solar cell characteristics of the samples after termination of the humidity/temperature cycle test indicated an average value of 92% relative to the initial value, and thus the occurrence of a significant degradation was indicated. Also, the measurement of shunt resistances indicated an average reduction of about 50%. Observing the shunt portion of this sample with an infrared camera, as in the comparative example 3, it could be found that the sample was shunted under the collector electrode.

EXAMPLE 5

Figure 5B:
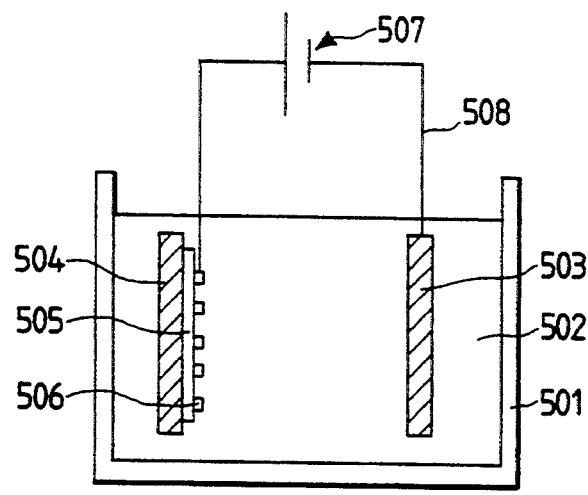

A collector electrode 209 was fabricated as shown in FIG. 5B, and a solar cell having a layer configuration as shown in FIG. 2A was fabricated in substantially the same way as in example 4. Layers up to the passivation layer 207 were deposited on the substrate 201 with the same procedure as in example 4.

Then, in the same way as in example 4, an upper electrode 208 was printed using a conductive paste having a composition containing 60 parts or Pd filler, 40 parts of epoxy (volume ratio), and 15 parts of MEK as solvent.

Next, in the following way, using the plating tank of FIG. 5B, a collector electrode 209 was formed. First, the substrate 201 was immersed in a neutral sulfamic acid solution for five seconds, and then immersed in a plating bath 501 filled with a plating liquid 502 held at a temperature of 55° C. and pH8.5, which liquid was a commercially available electroplating liquid C-100EP made by High Purity Chemicals K.K. Thereafter, using a power source 507, a voltage of about −0.5 volt was applied to the substrate 504, and the plating was made at a current density of 20mA/cm². Under these conditions, copper was deposited 2 μm thick only on the upper electrode 208 to form a collector electrode 209, and was not deposited on other portions.

Moreover, the bus bar 210 of a copper foil with an adhesive applied thereon was laminated, whereby a single cell 30 cm square was fabricated. Ten sheets of the sample were fabricated with the above-described method. Then, the encapsulation of these samples was made in the same way as in example 4. The initial characteristics of the obtained samples were such that the conversion efficiency was in a range of 6.0%±1%, the shunt resistance was in a range of 200KΩcm² to 350KΩcm², and the series resistance was 5Ω cm² in average, which were excellent characteristics.

Next, the durability characteristics were evaluated in the same way as in the example 4. After termination of the temperature/humidity cycle test, the solar cell characteristics of the samples were measured and showed an average value of 97% relative to the initial value with no significant degradation. Also, the measurement of shunt resistances indicated almost no variation.

From the above results, the solar cell of the present invention using the solar cell fabrication method of the present invention had an excellent yield, good characteristics and superior durability.

EXAMPLE 6

A solar cell having a layer configuration as shown in FIG. 2A was fabricated in the following way, with the collector electrode 209 being the three layer structure of nickel/copper/nickel.

Layers up to the passivation layer 207 were deposited on the substrate 201 in the same way as in example 4. Then, a collector electrode 209 was formed by depositing nickel 1 μm thick in the same way as in example 4, depositing copper 1 μm thick in the same ways as in example 5, and finally depositing nickel 1 μm thick. Finally, the bus bar 210 of a copper foil with an adhesive applied thereon was laminated, whereby a single cell 30 cm square was fabricated. Ten sheets of the samples were fabricated by the above-described method. Then, the encapsulation of these samples was made in the same way as in example 4. The initial characteristic of the obtained samples was 6.4%, with the shunt resistance being 4Ωcm², which were excellent characteristics.

Next, the durability characteristics of these samples was evaluated in the same way as in example 4. After termination of the temperature/humidity cycle test, the solar cell characteristics of the samples were measured and showed an average value of 98% relative to the initial value with no significant degradation. Also, the measurement of shunt resistance indicated almost no variation.

From the above results, the solar cells of the present invention using the solar cell fabrication method of the present invention had an excellent yield, good characteristics, and superior durability.

EXAMPLE 7

By shaping the upper electrode 208, the collector electrode 209 and the bus bar 210 as shown in FIG. 2D, a solar cell having a configuration as shown in FIG. 2A was fabricated in the same way as in example 4. In this case, the upper electrode was made by forming fingers each having a width of 50 μm and a length of 25 cm at an interval of 1 cm. Thereafter, by depositing nickel 3 μm thick in the same way as in example 4, the bus bar 209 of a copper foil with an adhesive applied thereon was bonded, whereby a single cell 30 cm square was fabricated.

Without encapsulation, the measurement of initial characteristics indicated that the efficiency (effective efficiency) in the area including the shaded portion of the collector electrode 209 and the bus bar 210 was 6.8% and the series resistance was 4Ωcm², which were excellent characteristics.

The present invention provides a thin film solar cell comprising at least one pair of semiconductor junctions deposited on a substrate with good characteristics and a superior durability, having a structure in which a substantially insulating passivation layer of a polymer resin is coated on the semiconductor and the upper electrode made of a conductive paste is laminated on the passivation layer, the polymer resin being any one component selected from polyester, copolymer of ethylene ad vinyl acetate, acrylic epoxy, and urethane, and having a solar light transmittance of 90% or greater, and the metal component of the conductive paste containing at least one component from silver, palladium, copper, and carbon.

Further, by laminating the collector electrode on the upper electrode by electroplating, it is possible to provide a solar cell having excellent characteristics and superior durability.

The present invention provides method of fabricating a thin film solar cell comprising at least one pair of semiconductor junctions deposited on a substrate, in which a passivation layer of a polymer resin is coated on the semiconductor layer, and an upper electrode made of a conductive paste containing a component capable of dissolving the polymer resin is laminated on the passivation layer. The fabrication method for the polymer resin passivation layer may be any one selected from electrocoating, electrolytic polymerization, plasma polymerization, spin coating, roll coating, and dipping. The component capable of dissolving the polymer resin of the conductive paste desirably contains at least one of ethyl acetate, methyl ethyl ketone, and toluene, whereby the solar cell can be produced with an excellent yield.

Further, by laminating the collector electrode on the upper electrode by electroplating, it is possible to provide a solar cell having excellent characteristics and a superior durability at a high yield.

The invention may be embodied in other specific forms without departing from the spirit or essential characteristics thereof. The present embodiments are therefor to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A photoelectric conversion element comprising a semiconductor layer, a passivation layer comprising an insulating or highly resistive polymer resting on said semiconductor layer, and a conductive member comprising a conductive paste on said passivation layer,
    wherein said semiconductor layer is electrically connected with said conductive member through the passivation layer.

2. The photoelectric conversion element according to claim 1, wherein said passivation layer comprises at least one of polyester, a copolymer of ethylene and vinyl acetate, acrylic, epoxy, and urethane.

3. The photoelectric conversion element according to claim 2, wherein the transmittance of said passivation layer with respect to solar light is 90% or greater.

4. The photoelelectric conversion element according to claim 1, wherein the transmittance of said passivation layer with respect to solar light is 90% or greater.

5. The photoelectric conversion element according to claim 1, wherein the conductive paste contains a conductive filler comprising at least one of silver, palladium, copper, carbon, and their alloys.

6. The photoelectric conversion element according to claim 1, wherein said conductive paste contains a binder comprising at least one of polyester, epoxy, and polyurethane.

7. A method of fabricating a photoelectric conversion elements , comprising the steps of:
    forming a passivation layer comprising an insulating or highly resistive polymer resin on a semiconductor layer; and
    forming on said passivation layer a conductive paste containing a component which dissolves at least one portion of said passivation layer.

8. The method of fabricating a photoelectric conversion element according to claims, wherein said passivation layer is formed by method selected from electrocoating, electrolytic polymerization, plasma polymerization, spin coating, roll coating, and dipping.

9. The method of fabricating a photoelectric conversion element according to claim 8, wherein said conductive paste contains a conductive filler comprising at least one of silver, palladium, copper, carbon, and their alloys.

10. The method of fabricating a photoelectric conversion element according to claim 7, wherein said conductive paste contains a conductive filler comprising at least one of silver, palladium, copper, carboy, and their alloys.

11. The method of fabricating a photoelectric conversion element according to claim 7, wherein said conductive paste contains a binder comprising at least one of polyester, epoxy, and polyurethane.

12. The method of fabricating a photoelectric conversion element according to claim 11, wherein said binder contains an unreacted component.

13. The method of fabricating a photoelectric conversion element according to claim 7, wherein said component which dissolves at least one portion of said passivation layer is made of at least one of ethyl acetate, methyl ketone, and toluene.

14. A photoelectric conversion element comprising a semiconductor layer, a passivation comprising an insulating or highly resistive polymer resin on said semiconductor layer, a first conductive member comprising a conductive paste on said passivation layer and a second conductive member on said first conductive member,
    wherein said semiconductor layer is electrically connected with said first conductive member through the passivation layer.

15. The photoelectric conversion element according to claim 14, wherein said passivation layer comprises at least one of polyester, a copolymer of ethylene and vinyl acetate, acrylic, epoxy, and polyurethane.

16. The photoelectric conversion element according to claim 15, wherein the transmittance of said passivation layer with respect to solar light is 90% or greater.

17. The photoelectric conversion element according to claim 14, wherein the transmittance of said passivation layer with respect to solar light is 90% or greater.

18. The photoelectric conversion element according to claim 14, wherein the conductive paste contains a conductive filler comprising at least one of silver, palladium, copper, carbon, and their alloys.

19. The photoelectric conversion element according to claim 14, wherein said conductive paste contains a binder comprising at least one of polyester, epoxy, and polyurethane.

20. The photoelectric conversion element according to claim 14, wherein said second conductive member on said first conductive member is formed by electroplating and comprises at least one of copper, aluminum, and chromium.

21. A method of fabricating a photoelectric conversion element, comprising the steps of:
    forming a passivation layer comprising an insulating or highly resistive polymer resin on a semiconductor layer;
    forming on said passivation layer a first conductive paste containing a component which dissolves at least one portion of said passivation layer; and
    forming a second conductive member on said first conductive paste and comprising said conductive paste.

22. The method of fabricating a photoelectric conversion element according to claim 21, wherein said passivation layer is formed by a method selected from electrocoating, electrolytic polymerization, plasma polymerization, spin coating, roll coating, and dipping.

23. The method of fabricating a photoelectric conversion element according to claim 22, wherein said conductive paste contains a conductive filler comprising at least one of silver, palladium, copper, carbon, and their alloys.

24. The method of fabricating a photoelectric conversion element according to claim 22, wherein said conductive paste contains a binder comprising at least one of polyester, epoxy, and polyurethane.

25. The method of fabricating a photoelectric conversion element according to claim 24, wherein said binder contains an unreacted component.

26. The method of fabricating a photoelectric conversion element according to claim 21, wherein said conductive paste contains a conductive filler comprising at least one of silver, palladium, copper, carbon, and their alloys.

27. The method of fabricating a photoelectric conversion element according to claim 21, wherein said component which dissolves at least one portion of said passivation layer comprises at least one of ethyl acetate, methyl ketone and toluene.

28. The method of fabricating a photoelectric conversion element according to claim 21, wherein said second conductive member on said first conductive member is formed by electroplating and comprises at least one of copper, aluminum, and chromium.

* * * * *

UNITED STATES PATENT AND TRADEMARK OFFICE
CERTIFICATE OF CORRECTION

PATENT NO. : 5,380,371
DATED      : January 10, 1995
INVENTOR(S): TSUTOMU MURAKAMI It is certified that error appears in the above-identified patent and that said Letters Patent is hereby corrected as shown below:

COLUMN 1

Line 37, "Meanwhile, as" should read --In--.
Line 39, "3KW." should read --3kW.--.
Line 40, "1Kw/m" should read --1kW/m--.
Line 41, "as are" should read --as $30m^2$ are--.
Line 44, "them" should read --it--.
Line 66, "player," should read --p layer,--.

COLUMN 2

Line 46, ".In" should read --In--.

COLUMN 5

Line 7, "casest" should read --cases,--.
Line 13, "past" should read --paste--.
Line 21, "electroder" should read --electrode--.
Line 59, "pintype" should read --pin-type--.

COLUMN 6

Line 13, "AIN" should read --AlN--.
Line 50, "to" should read --the--.
Line 56, "Group IV element" should read --Group IV elements--.

COLUMN 7

Line 42, "pllymerization" should read --polymerization--.

UNITED STATES PATENT AND TRADEMARK OFFICE
CERTIFICATE OF CORRECTION

PATENT NO. : 5,380,371
DATED : January 10, 1995
INVENTOR(S) : TSUTOMU MURAKAMI

It is certified that error appears in the above-identified patent and that said Letters Patent is hereby corrected as shown below:

COLUMN 9

Line 36, "electrodes" should read --electrode,--.
    Line 40, "layers" should read --layer,--.
    Line 45, "pasted" should read --paste,--.

COLUMN 10

Line 43, "55." should read --5B.--.
    Line 46, "(FIG. 25)," should read --(FIG. 2B),--.
    Line 47, "wire," should read --wire.--.
    Line 51, "FIG. 55." should read --FIG. 5B.--.

COLUMN 11

Line 2, "No, 1345" should read --No. 1345--.
    Line 12, "layers" should read --layer,--.
    Line 50, "biassed" should read --biased--.

COLUMN 12

Line 35, "abovementioned" should read --above-mentioned--.

COLUMN 14

TABLE 1, "Ehthyl" should read --Ethyl--;
          "1000KΩ $cm^2$" should read --1000kΩ $cm^2$--;
          "250KΩ $cm^2$" should read --250kΩ $cm^2$--;
          "50KΩ $cm^2$" should read --50kΩ $cm^2$--; and
          "10KΩ $cm^2$" should read --10kΩ $cm^2$--.

UNITED STATES PATENT AND TRADEMARK OFFICE
CERTIFICATE OF CORRECTION

PATENT NO. : 5,380,371
DATED : January 10, 1995
INVENTOR(S) : TSUTOMU MURAKAMI

It is certified that error appears in the above-identified patent and that said Letters Patent is hereby corrected as shown below:

COLUMN 14

TABLE 2, "800K$\Omega$ cm$^2$" should read --800k$\Omega$ cm$^2$--;
"500K$\Omega$ cm$^2$" should read --500k$\Omega$ cm$^2$--;
"35K$\Omega$ cm$^2$" should read --35k$\Omega$ cm$^2$--; and
"10K$\Omega$ cm$^2$" should read --10k$\Omega$ cm$^2$--.

TABLE 3, "120K$\Omega$ cm$^2$" should read --120k$\Omega$ cm$^2$--; and
"50K$\Omega$ cm$^2$" should read --50k$\Omega$ cm$^2$--.

COLUMN 15

TABLE 3-continued,
"35K$\Omega$ cm$^2$" should read --35k$\Omega$ cm$^2$--; and
"10K$\Omega$ cm$^2$" should read --10k$\Omega$ cm$^2$--.

TABLE 4, "[K$\Omega$ cm$^2$]" should read --[k$\Omega$ cm$^2$]--.
Line 55, "5K·$\Omega$ cm$^2$" should read --5k$\Omega$ cm$^2$--.

COLUMN 16

Line 67, "15K·$\Omega$ cm$^2$ to 200K$\Omega$ cm$^2$" should read
--15k·$\Omega$ cm$^2$ to 200k$\Omega$ cm$^2$--.

COLUMN 17

Line 27, "was" should read --were--.
Line 56, "300K$\Omega$ cm$^2$ to 500K$\Omega$ cm$^2$" should read
--300k$\Omega$ cm$^2$ to 500k$\Omega$ cm$^2$--.

UNITED STATES PATENT AND TRADEMARK OFFICE
CERTIFICATE OF CORRECTION

PATENT NO. : 5,380,371
DATED : January 10, 1995
INVENTOR(S) : TSUTOMU MURAKAMI

It is certified that error appears in the above-identified patent and that said Letters Patent is hereby corrected as shown below:

COLUMN 18

Line 32, "100KΩ $cm^2$ to 300KΩ $cm^2$" should read --100kΩ $cm^2$ to 300kΩ $cm^2$--.

COLUMN 19

Line 43, "300KΩ $cm^2$" should read --300kΩ $cm^2$--.
Line 44, "500KΩ $cm^2$" should read --500kΩ $cm^2$--.
Line 47, "mw/$cm^2$," should read --mW/$cm^2$,--.
Line 67, "sam" should read --same--.

COLUMN 20

Line 26, "5KΩ $cm^2$" should read --5kΩ $cm^2$--.
Line 36, "10KΩ $cm^2$" should read --10kΩ $cm^2$--.
Line 51, "be" should read --by--.

COLUMN 21

Line 3, "15KΩ $cm^2$" should read --15kΩ $cm^2$--.
Line 26, "or" should read --of--.
Line 51, "200KΩ $cm^2$" should read --200kΩ $cm^2$--.
Line 52, "350KΩ $cm^2$" should read --350kΩ $cm^2$--.

COLUMN 22

Line 7, "ways" should read --way--.
Line 57, "ad" should read --and--.

UNITED STATES PATENT AND TRADEMARK OFFICE
CERTIFICATE OF CORRECTION

PATENT NO. : 5,380,371
DATED : January 10, 1995
INVENTOR(S) : TSUTOMU MURAKAMI

It is certified that error appears in the above-identified patent and that said Letters Patent is hereby corrected as shown below:

COLUMN 23

Line 22, "therefor" should read --therefore--.
Line 31, "resting" should read --resin--.
Line 57, "elements ," should read --element,--.
Line 65, "claims," should read --claim 7,--.
Line 66, "method" should read --a method--.

COLUMN 24

Line 9, "carboy," should read --carbon,--.
Line 24, "passivation" should read --passivation layer--.
Line 64, "and" should be deleted.

COLUMN 26

Line 10, "ketone and" should read --ketone, and--.

Signed and Sealed this

Eleventh Day of July, 1995

*Attest:*

BRUCE LEHMAN

*Attesting Officer*     *Commissioner of Patents and Trademarks*